(12) United States Patent
Fitzmaurice et al.

(10) Patent No.: US 6,740,259 B1
(45) Date of Patent: May 25, 2004

(54) METHOD OF MANUFACTURE OF CERAMIC MATERIALS

(75) Inventors: Jonathan C Fitzmaurice, Southampton (GB); David R Moore, Farnborough (GB)

(73) Assignee: Qinetiq Limited, Hants (GB)

( * ) Notice: Subject to any disclaimer, the term of this patent is extended or adjusted under 35 U.S.C. 154(b) by 0 days.

(21) Appl. No.: 09/959,186

(22) PCT Filed: Apr. 13, 2000

(86) PCT No.: PCT/GB00/01410

§ 371 (c)(1),
(2), (4) Date: Nov. 8, 2001

(87) PCT Pub. No.: WO00/64834

PCT Pub. Date: Nov. 2, 2000

(30) Foreign Application Priority Data

Apr. 27, 1999 (GB) .............................................. 9909616

(51) Int. Cl.⁷ ......................... C04B 35/00; C04B 41/00; H01L 21/208
(52) U.S. Cl. .................. 252/500; 252/518.1; 252/519.1; 501/1; 501/10; 501/94; 505/1; 505/725; 427/62; 204/157.15; 204/157.62
(58) Field of Search .............................. 252/500, 518.1, 252/519.1; 501/1, 10, 94; 505/1, 725; 427/62; 704/157.15, 157.42

(56) References Cited

U.S. PATENT DOCUMENTS

| 5,100,870 A | | 3/1992 | Chen et al. ..................... 505/1 |
| 6,063,736 A | * | 5/2000 | Miryara et al. .............. 505/126 |
| 6,253,831 B1 | * | 7/2001 | Genma et al. ............... 164/499 |

FOREIGN PATENT DOCUMENTS

| EP | 0 316741 | | 5/1989 | |
| JP | 04-160062 | * | 6/1992 | ........... C01F/11/00 |
| WO | WO/0033366 | | 6/2000 | |
| WO | WO 00/33366 | | 7/2000 | ......... H01L/21/208 |

* cited by examiner

Primary Examiner—Yogendra N. Gupta
Assistant Examiner—Kallambella Vijayakumar
(74) Attorney, Agent, or Firm—Nixon & Vanderhye P.C.

(57) ABSTRACT

A method of manufacture of a ceramic material comprises the steps of preparing a melt of the ceramic materials, cooling the melt slowly through the freezing point of the material to initiate solidification, holding the melt at a temperature below the freezing point of the material whilst solidification progresses and characterised in that during solidification an ultrasonic field is applied to the melt. The melt composition may be selected to include an excess of one or more ceramic materials so as to produce a second phase dispersed in the solidified product during solidification. Also claimed is a ceramic material produced by the method described. The ceramic material may be a superconductor.

4 Claims, No Drawings

METHOD OF MANUFACTURE OF CERAMIC MATERIALS

The invention relates to a method of manufacture of ceramic materials; it has particularly beneficial application to a method of manufacture for ceramic materials containing a finely dispersed second phase within an otherwise homogeneous microstructure such as superconductors containing a flux pinning phase.

Techniques relying on solidification of a melt are widely used in the manufacture of ceramics, ranging from, at the simplest, solidification of a crucible-contained melt, to more refined techniques such as the melt textured growth process. There is a general desire in many cases to ensure that the ceramic solidifies with a homogeneous microstructure. Additionally, problems arise during solidification in those ceramic materials which rely on an evenly-dispersed second phase within the microstructure to confer a particular desired property.

An example of this problem is encountered during the manufacture of a large homogeneous lump of the Yttrium Barium Copper Oxide 123 (YBCO-123) phase high temperature superconductor which contains a second phase of YBCO-211 material the second phase as a fine dispersion of flux pinning centres. At present it is difficult to control the distribution and particle size of the YBCO-211 phase which acts to pin the magnetic flux lines within the material. An enhanced homogeneity of microstructure and more even distribution of pinning centres would enhance the effectiveness of magnetic flux pinning itself, resulting in materials with enhanced critical current density and enhanced repulsion of external magnetic fields.

It is an object of the present invention to provide an improved method of manufacture of ceramic materials by solidification from a melt which overcomes or alleviates one or more of the drawbacks of previous melt solidification processes.

According to the invention a method of manufacture of a ceramic material comprising the steps of: preparing a melt of the ceramic materials; cooling the melt through the freezing point of the material to initiate solidification; holding the melt at a temperature below the freezing point of the material during solidification and applying ultrasound to the melt during solidification.

This has the effect of breaking down the crystal nucleation centres at the solid-liquid interface by acoustic streaming, standing acoustic waves or the cavitation effect.

Ceramic materials suitable include oxides of elements from Group II and Periods 4, 5 and 6 of the periodic table of the elements. The method could also be applicable to mixtures containing salts such as carbonates, nitrates, hydroxides, sulphides or nitrides.

The ceramic materials, are constantly mixed by the acoustic field and a more homogeneous crystal or polycrystalline material is formed. The mixing allows maximum use of the materials and prevents formation of large regions of product which isolates unreacted ceramic materials. The enhanced processing efficiency offered by the method produces significant cost savings by reducing the time at which the material needs to be maintained at the high processing temperatures involved. The method according to the invention thus provides a more efficient manufacturing process for superconducting and engineering ceramics having increased quality (through improved homogeneity) as well as reduction in the cost of these materials through more efficient processing.

The method is particularly suited to ceramics in which deliberate additions of an excess of one or more materials are made to produce a second phase dispersion in the solidified product, such as high temperature superconducting ceramics (HTSCs). The ultrasonic field serves in this case not only to enhance the solidification process but also to ensure that the excess is finely distributed within the melt and the second phase is thus similarly distributed through the subsequent solid product.

A further advantage is that accumulation of unreacted products at grain boundaries will also be reduced by the action of ultrasound thereby allowing the possibility of increased transport critical current densities (i.e. the current which could flow along any polycrystalline shape, and specifically in a wire or tape conductor). The problem of poor quality of grain boundaries and the time and cost in producing "clean" high quality grain boundaries is thereby overcome. This is one of the most significant problems hindering the exploitation of HTSC materials for high power engineering applications.

The enhanced magnetic flux pinning resulting from the more even dispersion of flux pinning centres when the method is applied to formation of ceramic superconductors results in enhanced critical current density and enhanced repulsion of external magnetic fields. This provides for the manufacture of improved fault current limiters, current leads, levitators, frictionless bearings and magnetic energy storage devices compared with any presently available. The method also has application in improved and advanced HTSC wire production used to produce superconducting motors, generators, cables, other fault current limiters and numerous other devices.

The method according to the invention has not only application to ceramics comprising a ceramic matrix and a second phase of flux pinning material, but to ceramics where a second phase is required to be evenly distributed. Moreover, the method also has application to single phase ceramics to ensure a homogeneous microstructure.

What is claimed is:

1. A method of manufacture of a ceramic material comprising the steps of: preparing a melt of the ceramic materials; cooling the melt slowly through the freezing point of the material to initiate solidification; holding the melt at a temperature below the freezing point of the material while solidification progresses and wherein during solidification an ultrasonic field is applied to the melt.

2. A method of manufacture of ceramic materials as claimed in claim 1 wherein the melt composition is selected to include an excess of one or more ceramic materials so as to produce a second phase dispersed in the solidified product during solidification.

3. A method of manufacture of a ceramic material as claimed in claim 2, wherein the melt composition forms a first phase of yttrium barium copper oxide (123) and the second dispersed phase is formed from yttrium barium copper oxide (211).

4. A method of manufacture of a ceramic material as claimed in claim 3, wherein the ceramic material is a superconductor.

* * * * *